(12) United States Patent
Su et al.

(10) Patent No.: US 12,494,746 B2
(45) Date of Patent: Dec. 9, 2025

(54) TEMPERATURE COMPENSATION CIRCUIT OF POWER AMPLIFIER AND TEMPERATURE COMPENSATION METHOD

(71) Applicant: SMARTER MICROELECTRONICS (GUANG ZHOU) CO., LTD., Guangzhou (CN)

(72) Inventors: Qiang Su, Guangzhou (CN); Yongle Li, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 530 days.

(21) Appl. No.: 18/064,264

(22) Filed: Dec. 10, 2022

(65) Prior Publication Data

US 2023/0104737 A1 Apr. 6, 2023

Related U.S. Application Data

(63) Continuation of application No. PCT/CN2021/104501, filed on Jul. 5, 2021.

(30) Foreign Application Priority Data

Jul. 6, 2020 (CN) .......................... 202010641999.3

(51) Int. Cl.
*H03F 1/30* (2006.01)
*H03F 3/04* (2006.01)
*H03F 3/21* (2006.01)

(52) U.S. Cl.
CPC ............... *H03F 1/301* (2013.01); *H03F 3/21* (2013.01); *H03F 2200/447* (2013.01)

(58) Field of Classification Search
CPC ...... H03F 1/301; H03F 3/21; H03F 2200/447; H03F 3/195; H03F 1/30; H03F 1/307;
(Continued)

(56) References Cited

U.S. PATENT DOCUMENTS 7,215,204 B2 * 5/2007 Bambridge ............... H03F 1/56
361/764
7,256,653 B2 * 8/2007 Maya ........................ H03F 1/30
330/289

(Continued)

*Primary Examiner* — Khanh V Nguyen
(74) *Attorney, Agent, or Firm* — Syncoda LLC; Feng Ma

(57) ABSTRACT

A temperature compensation circuit is configured to generate a first electrical signal corresponding to the current ambient temperature, use the first electrical signal to adjust a second electrical signal received by an electrical signal input end, and obtain a third electrical signal; and output the third electrical signal to a power control circuit. The power control circuit is configured to convert the third electrical signal into a fourth electrical signal and output the fourth electrical signal to a power amplifier. The fourth electrical signal is used for controlling the gain of the power amplifier to present a preset change rule following a temperature change. Thus, by adding the described temperature compensation circuit in a power amplification circuit, the stability of the gain and the stability of the output power of a power amplifier are ensured, and the performance of the power amplifier is not affected by a change in temperature.

9 Claims, 7 Drawing Sheets

(58) Field of Classification Search
CPC .......... H03F 1/302; H03F 1/3217; H03F 3/26; H03F 3/45479; H03F 3/45071; H03F 3/45085
USPC .................................. 330/256, 266, 273, 289
See application file for complete search history.

(56) References Cited

U.S. PATENT DOCUMENTS

| | | | |
|---|---|---|---|
| 8,183,928 B2* | 5/2012 | Kim | H03F 1/303 330/285 |
| 8,659,358 B2* | 2/2014 | Masuda | H03G 3/3042 330/285 |
| 2006/0238257 A1* | 10/2006 | Han | H03F 1/30 330/289 |
| 2020/0036336 A1* | 1/2020 | Su | H03F 3/195 |

* cited by examiner

TEMPERATURE COMPENSATION CIRCUIT OF POWER AMPLIFIER AND TEMPERATURE COMPENSATION METHOD

CROSS-REFERENCE TO RELATED APPLICATIONS

This is a continuation of International Patent Application No. PCT/CN2021/104501 filed on Jul. 5, 2021, which claims priority to Chinese Patent Application No. 202010641999.3 filed on Jul. 6, 2020. The disclosures of the above-referenced applications are hereby incorporated by reference in their entirety.

BACKGROUND

A power amplifier (referred to as "PA") operates in a saturation mode, to meet a requirement of a 3rd Generation Partnership Project (3GPP) protocol on power time template (PVT) of output power of a Global System for Mobile Communication (GSM) in a time domain, output power of PA is controlled by an external voltage Vramp.

When a power amplification circuit operates in high and low temperature states, parameters of circuit elements may vary with temperature, therefore gain and output power of PA may decrease at high temperature; on the contrary, the gain and output power of PA may increase at low temperature. In this case, compared with normal temperature, variation between high temperature and low temperature may make the gain and output power of PA vary greatly, which makes it difficult to meet requirements of industry indicators.

SUMMARY

The disclosure relates to electronic technologies, and in particular to a temperature compensation circuit of a power amplifier and a temperature compensation method of a power amplifier.

In order to solve the above technical problems, embodiments of the disclosure are expected to provide a temperature compensation circuit of a PA and a temperature compensation method of a PA.

In a first aspect, the disclosure provides a temperature compensation circuit configured to: generate a first electrical signal corresponding to current ambient temperature; adjust, by using the first electrical signal, a second electrical signal received by an electrical signal input end, to obtain a third electrical signal; and output the third electrical signal to a power control circuit which is configured to convert the third electrical signal into a fourth electrical signal and output the fourth electrical signal to the PA.

Here the fourth electrical signal controls gain of the PA to present a preset variation rule with variation of temperature.

In above solution, the temperature compensation circuit may include a current compensation circuit and a current-to-voltage conversion circuit. The current compensation circuit is configured to: generate the first electrical signal corresponding to the current ambient temperature; and output the first electrical signal to adjust the second electrical signal, to obtain an intermediate electrical signal, here each of the first electrical signal, the second electrical signal and the intermediate electrical signal is a current signal. The current-to-voltage conversion circuit is configured to convert the intermediate electrical signal into the third electrical signal to be output, here the third electrical signal is a voltage signal.

In above solution, the current compensation circuit may include a temperature-controlled current source and a current adjustment circuit. The temperature-controlled current source is configured to provide a current signal varying with temperature. The current adjustment circuit is configured to adjust the current signal provided by the temperature-controlled current source to the first electrical signal.

In above solution, the current adjustment circuit may include a steady state current source, a first Field-Effect Transistor (FET) and a second FET. The steady state current source has an end connected to a first voltage source and another end connected to the temperature-controlled current source, and an intermediate connection node between the steady state current source and the temperature-controlled current source is connected to a gate and a drain of the first FET. The gate of the first FET is connected to a gate of the second FET. A source of the first FET and a source of the second FET are connected to a second voltage source. A drain of the second FET is used as an output end of the current compensation circuit, to output the first electrical signal.

In above solution, the current-to-voltage conversion circuit may include a first resistor having an end connected to ground and another end connected to an output end of the current compensation circuit and an input end of the power control circuit.

In above solution, the current-to-voltage conversion circuit may further include a first capacitor connected in parallel with the first resistor.

In above solution, the preset variation rule may be that the gain of the PA increases with temperature rising and decreases with temperature dropping.

In above solution, the temperature compensation circuit may be a voltage compensation circuit which includes a temperature-controlled voltage source and a voltage adjustment circuit. The temperature-controlled voltage source is configured to provide a voltage signal varying with temperature. The voltage adjustment circuit is configured to adjust the voltage signal provided by the temperature-controlled voltage source to the first electrical signal. Each of the first electrical signal and the second electrical signal may be a voltage signal.

In above solution, the power control circuit may include at least a Low Dropout Regulator (LDO) having a forward input end used as an input end of the power control circuit to receive the third electrical signal.

In a second aspect, there is provided a temperature compensation method of a PA, including the following operations.

A first electrical signal corresponding to current ambient temperature is generated by controlling a temperature compensation circuit.

A second electrical signal is adjusted by using the first electrical signal, to obtain a third electrical signal.

The third electrical signal is converted into a fourth electrical signal by controlling a power control circuit, and the fourth electrical signal is output to the PA.

Gain of the PA is controlled by using the fourth electrical signal, to present a preset variation rule with variation of temperature.

The embodiments of the disclosure provide a temperature compensation circuit of a PA and a temperature compensation method of a PA. The temperature compensation circuit is configured to: generate a first electrical signal corresponding to current ambient temperature; adjust, by using the first electrical signal, a second electrical signal received by an electrical signal input end, to obtain a third electrical signal;

and output the third electrical signal to a power control circuit which is configured to convert the third electrical signal into a fourth electrical signal and output the fourth electrical signal to the PA, here the fourth electrical signal controls gain of the PA to present a preset variation rule with variation of temperature. In this way, by adding the aforementioned temperature compensation circuit in a power amplification circuit, stabilities of the gain and output power of PA are ensured, and performance of PA is not affected by variation of temperature.

DETAILED DESCRIPTION

In order to enable a more detailed understanding of features and technical contents of embodiments of the disclosure, implementation of the embodiments of the disclosure will be described in detail below in combination with the accompanying drawings which are provided for reference and illustration only and are not intended to limit the embodiments of the disclosure.

Figure 1:
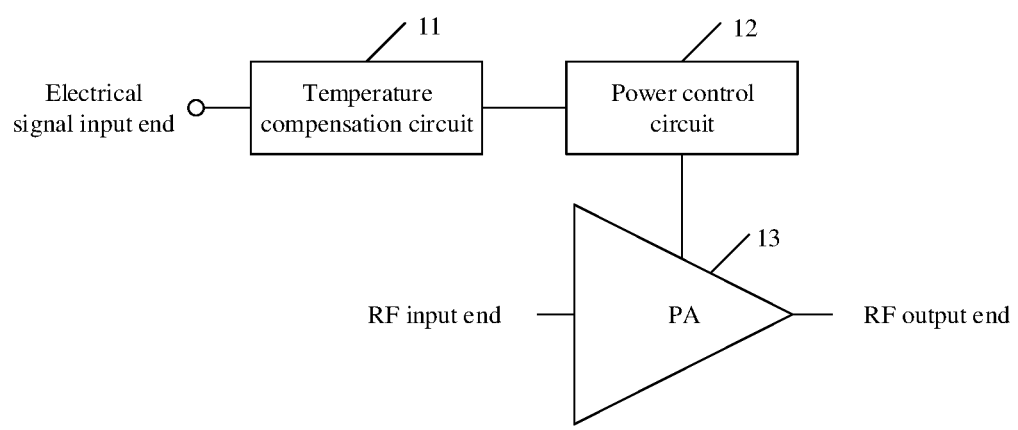
FIG. 1 is a schematic diagram of a first composition structure of a temperature compensation circuit according to an embodiment of the disclosure.

FIG. 1 is a schematic diagram of a first composition structure of a temperature compensation circuit according to an embodiment of the disclosure.

As shown in FIG. 1, the temperature compensation circuit 11 is configured to: generate a first electrical signal corresponding to current ambient temperature; adjust, by using the first electrical signal, a second electrical signal received by an electrical signal input end, to obtain a third electrical signal; and output the third electrical signal to a power control circuit 12 which is configured to convert the third electrical signal into a fourth electrical signal and output the fourth electrical signal to PA 13.

Here the fourth electrical signal controls gain of PA 13 to present a preset variation rule with variation of temperature.

Here the temperature compensation circuit 11 may adaptively adjust the third electrical signal according to variation of the current ambient temperature, so that stabilities of the gain and output power of PA 13 are ensured, and performance of PA is not affected by variation of temperature.

When PA operates in high and low temperature states, parameters of circuit elements may vary with temperature, therefore the gain and output power of PA may decrease at high temperature; on the contrary, the gain and output power of PA may increase at low temperature. Therefore, stability of the gain of PA may be ensured by adjusting the fourth electrical signal.

In a practical application, the temperature compensation circuit may compensate a current signal converted from an external input voltage Vramp, or may directly compensate the external input voltage Vramp signal. That is, the second electrical signal received by the electrical signal input end is a current signal or a voltage signal.

Figure 2:
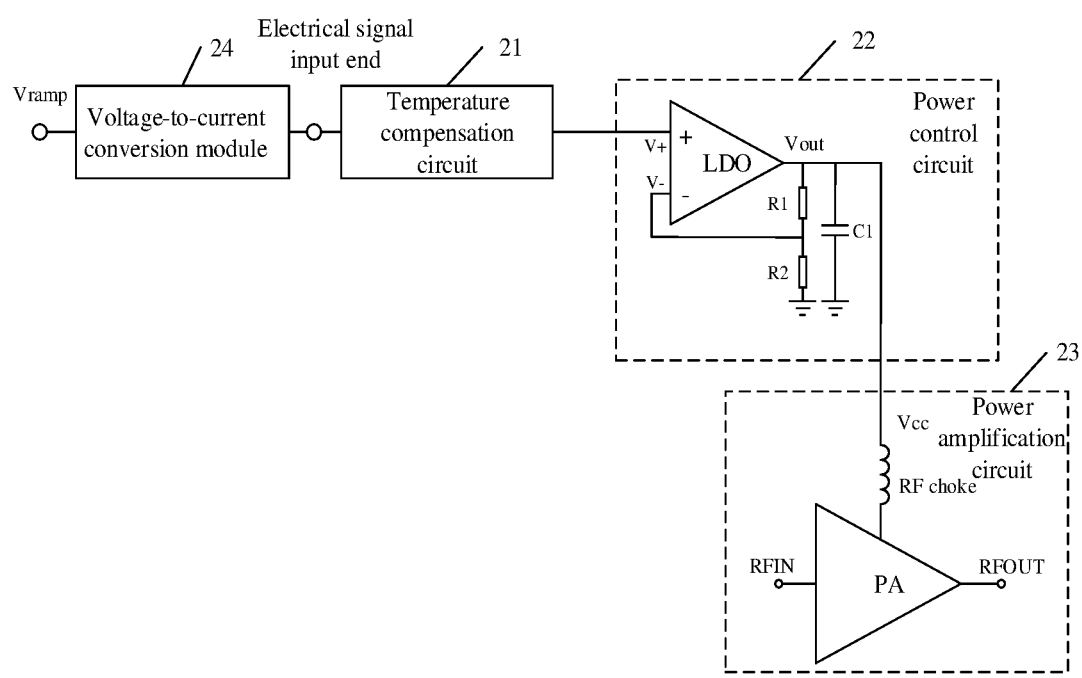
FIG. 2 is a schematic diagram of a composition structure of a power control circuit according to an embodiment of the disclosure.

FIG. 2 is a schematic diagram of a composition structure of a power control circuit according to an embodiment of the disclosure. As shown in FIG. 2, a temperature compensation circuit 21 performs temperature compensation on an electrical signal at an electrical signal input end, and then inputs the temperature-compensated electrical signal to a power control circuit 22. The power control circuit 22 adjusts a voltage signal input to a V+ end to obtain a voltage signal Vout (i.e., Vcc) and provides the voltage signal Vout to a power amplification circuit 23.

The power control circuit 22 includes LDO, resistors R1 and R2, and a capacitor C1. A forward input end V+ of LDO receives the voltage signal output by the temperature compensation circuit 21. After resistors R1 and R2 are connected in series, one end of resistors R1 and R2 connected in series is connected to an output end of LDO, and the other end of resistors R1 and R2 connected in series is connected to ground. A reverse input end of LDO is connected to an intermediate node between R1 and R2. One end of the capacitor C1 is connected to the output end of LDO, and the other end of the capacitor C1 is connected to ground. The output end of LDO is connected to a collector of PA through Radio Frequency (RF) choke. Usually, variation of output power RFOUT with Vcc may be achieved by controlling voltage at the collector of PA. The larger the Vcc, the larger the output power of PA, since the output power of PA is proportional to $Vcc^2$. The smaller the Vcc, the smaller the output power of PA.

The power amplification circuit 23 includes PA and RF choke. A RF input end (RFIN) of PA is input with a RF signal without amplification, and a RF output end (RFOUT) of PA outputs the amplified RF signal. The RF choke eliminates influence of the RF signal of PA on the electrical signal of the power control circuit 22.

Based on the above application circuit, a composition structure of the temperature compensation circuit is illustrated by way of example. When the temperature compensation circuit performs temperature compensation on a current signal, that is, the second electrical signal is a current signal, the temperature compensation circuit performs temperature compensation on a current converted from an external input voltage Vramp or directly performs temperature compensation on the external input voltage Vramp.

As shown in FIG. 2, when the external input voltage Vramp is input, the practical application circuit also includes a voltage-to-current conversion circuit 24 which converts the voltage Vramp into a current, and the temperature compensation circuit performs temperature compensation on the current.

In some embodiments, the temperature compensation circuit may include a current compensation circuit and a current-to-voltage conversion circuit. The current compensation circuit is configured to: generate the first electrical signal corresponding to the current ambient temperature; and output the first electrical signal to adjust the second electrical signal, to obtain an intermediate electrical signal, here each of the first electrical signal, the second electrical signal and the intermediate electrical signal is a current signal. The current-to-voltage conversion circuit is configured to convert the intermediate electrical signal into the third electrical signal to be output, here the third electrical signal is a voltage signal.

That is, when the current is compensated, the current compensation circuit generates the first electrical signal corresponding to the current ambient temperature. Since LDO may receive a voltage signal only, the current-to-voltage conversion circuit is required to convert the intermediate current signal into a voltage signal and input the voltage signal to the forward input end V+ of LDO.

Specifically, the current compensation circuit may include a temperature-controlled current source and a current adjustment circuit. The temperature-controlled current source is configured to provide a current signal varying with temperature. The current adjustment circuit is configured to adjust the current signal provided by the temperature-controlled current source to the first electrical signal.

The temperature-controlled current source is configured to provide the current signal varying with temperature to the current adjustment circuit. The current signal output by the temperature-controlled current source is proportional to the absolute temperature.

The current adjustment circuit has functions of current amplification and reduction, and other functions, so as to provide accurate current signals to subsequent circuits. The current adjustment circuit may include combination of resistors, capacitors, transistors and other elements.

For example, the current adjustment circuit may include a steady state current source, a first FET and a second FET. The steady state current source has an end connected to a first voltage source and another end connected to the temperature-controlled current source, and an intermediate connection node between the steady state current source and the temperature-controlled current source is connected to a gate and a drain of the first FET. The gate of the first FET is connected to a gate of the second FET. A source of the first FET and a source of the second FET are connected to a second voltage source. A drain of the second FET is used as an output end of the current compensation circuit, to output the first electrical signal. Here each of the first FET and the second FET is a P-type FET.

Just as its name implies, the current-to-voltage conversion circuit converts the intermediate current signal compensated by the current compensation circuit into a voltage signal (i.e., the third electrical signal) and inputs the voltage signal to the forward input end V+ of LDO.

Exemplarily, the current-to-voltage conversion circuit may include a first resistor having an end connected to ground and another end connected to an output end of the current compensation circuit and an input end of the power control circuit.

A capacitor may also be connected in parallel with the first resistor, to ensure stability of the output voltage.

Figure 3:
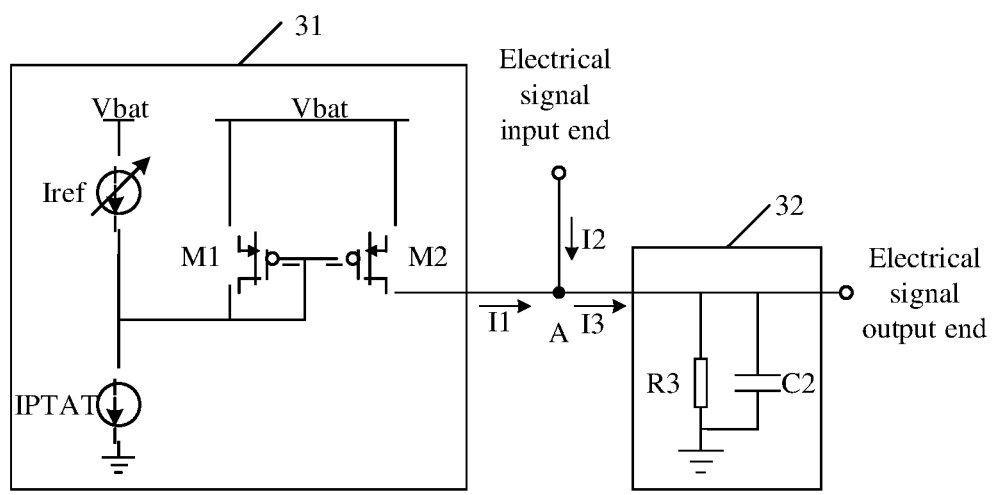
FIG. 3 is a schematic diagram of a second composition structure of a temperature compensation circuit according to an embodiment of the disclosure.

FIG. 3 is a schematic diagram of a second composition structure of a temperature compensation circuit according to an embodiment of the disclosure. As shown in FIG. 3, the temperature compensation circuit includes a current compensation circuit 31 and a current-to-voltage conversion circuit 32.

The current compensation circuit 31 includes a temperature-controlled current source $I_{PTAT}$, a steady state current source Iref, a first FET M1 and a second FET M2. Here the steady state current source is configured to provide a fixed current signal, an electrical signal of a steady state power supply does not vary with variation of temperature, each of M1 and M2 is a P-type FET. One end of Iref is connected to a voltage source Vbat1, the other end of Iref is connected to one end of $I_{PTAT}$, and the other end of $I_{PTAT}$ is connected to ground. An intermediate node between $I_{PTAT}$ and Iref is connected to a gate and a drain of M1, a source of M1 and a source of M2 are connected to a voltage source Vbat2, and a drain of M2 outputs a first electrical signal I1.

The current-to-voltage conversion circuit 32 includes a resistor R3 and a capacitor C2 connected in parallel. R3 performs current-to-voltage conversion, and C2 is used to stabilize voltage across R3.

When temperature rises, current $I_{PTAT}$ increases and Iref remains unchanged. At this time, $I_{PTAT}$–Iref increases and flows into M1. M1 mirrors current $I_{PTAT}$–Iref to M2, and after the current $I_{PTAT}$–Iref is amplified by M2, current I1 is output. I1 meets with current I2 of the electrical signal input end at a node A, to obtain current I3. The node A is a connection node between the current compensation circuit 31 and V+ of LDO. Output current I3 of the current compensation circuit 31 flows into R1, so that voltage across R1 increases from I2*R1 to (I1+I2)*R1, that is, input voltage V+ of LDO in FIG. 2 increases, thereby increasing output voltage Vout of LDO, that is, voltage Vcc at the collector of PA increases. Since each of the gain and output power of PA is proportional to $Vcc^2$, the gain and output power of PA will increase too. Therefore, compared with normal temperature, the gain and output power of PA at high temperature have little variation or keep the same.

On the contrary, when temperature drops, current $I_{PTAT}$ decreases and Iref remains unchanged. At this time, $I_{PTAT}$–Iref decreases and flows into M1. M1 mirrors current $I_{PTAT}$–Iref to M2, and after the current $I_{PTAT}$–Iref is amplified by M2, current I1 is output. I1 meets with current I2 of the electrical signal input end at a node A, to obtain current I3. The node A is a connection node between the current compensation circuit 31 and V+ of LDO. Output current I3 of the current compensation circuit 31 flows into R1, so that voltage across R1 decreases from I2*R1 to (I2−I1)*R1, that is, input voltage V+ of LDO in FIG. 2 decreases, thereby decreasing output voltage Vout of LDO, that is, voltage Vcc at the collector of PA decreases. Since each of the gain and output power of PA is proportional to $Vcc^2$, the gain and output power of PA will decrease too. Therefore, compared with normal temperature, the gain and output power of PA at low temperature have little variation or keep the same.

Figure 4:
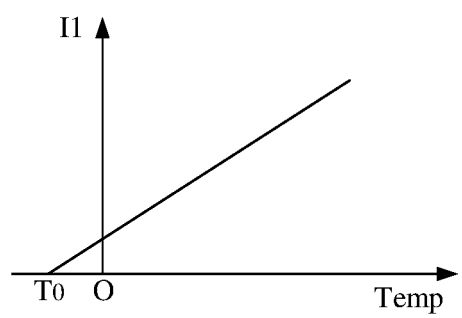
FIG. 4 is a schematic diagram of a linear relationship between current and temperature according to an embodiment of the disclosure.

$I_{PTAT}$ is a current source proportional to the absolute temperature, and Iref is used to adjust a slope of temperature compensation. FIG. 4 is a schematic diagram of a linear relationship between current and temperature according to an embodiment of the disclosure, in which the abscissa is temperature (Temp), and the ordinate is a first current I1 output by the current compensation circuit 31. The current I1 has a positive linear correlation to the temperature Temp, and T0 is temperature when $I_{PTAT}$–Iref=0.

Figure 5:
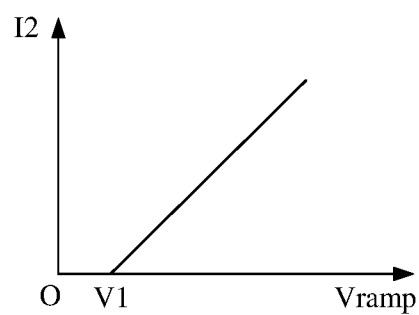
FIG. 5 is a schematic diagram of a linear relationship between voltage and current in according to an embodiment of the disclosure.

In a practical application, when the temperature compensation circuit converts the external input voltage Vramp into current for temperature compensation. A voltage-to-current conversion circuit is required to add to a front end of the temperature compensation circuit, and voltage has a positive linear correlation to current. FIG. 5 is a schematic diagram of a linear relationship between voltage and current in according to an embodiment of the disclosure, in which the abscissa is voltage (Vramp) and the ordinate is current I2. When the voltage (Vramp) is less than V1, the current I2 is 0, which improves forward isolation of PA at an off state. When the voltage (Vramp) is greater than V1, the current I2 is proportional to the voltage (Vramp).

The temperature-controlled current source $I_{PTAT}$ and the steady state current source Iref may be implemented in various forms. Transistors of PA may be Metal-Oxide-Semiconductor (MOS) FET, Heterojunction Bipolar Transistor (HBT), Bipolar Junction Transistor (BJT), and other circuit elements with RF power amplification functions.

PA may include multiple transistors, for example, multiple transistors connected in series, and the gain of PA is a total gain after multiple transistors are connected in series.

In the embodiment of the disclosure, the first FET and the second FET in the temperature compensation circuit form a current mirror circuit, and each of the first FET and the second FET may also be a N-type FET.

Specifically, the current adjustment circuit may include a steady state current source, a first FET and a second FET. The steady state current source has an end connected to a first voltage source and another end connected to the temperature-controlled current source, and an intermediate connection node between the steady state current source and the temperature-controlled current source is connected to a gate and a drain of the first FET. The gate of the first FET is connected to a gate of the second FET. A drain of the first FET and a drain of the second PET are connected to a second voltage source. A source of the second FET is used as an output end of the current compensation circuit, to output the first electrical signal.

With the above solution, by adding the aforementioned temperature compensation circuit in a power amplification circuit, temperature compensation is performed on a current signal converted from the external input voltage Vramp for power control, stabilities of the gain and output power of PA are ensured, and performance of PA is not affected by variation of temperature.

Based on the above application circuit, a composition structure of the temperature compensation circuit is illustrated by way of example. When the temperature compensation circuit performs temperature compensation on a voltage signal, each of the first electrical signal and the second electrical signal is a voltage signal, the temperature compensation circuit directly performs compensation on the external input voltage Vramp.

Figure 6:
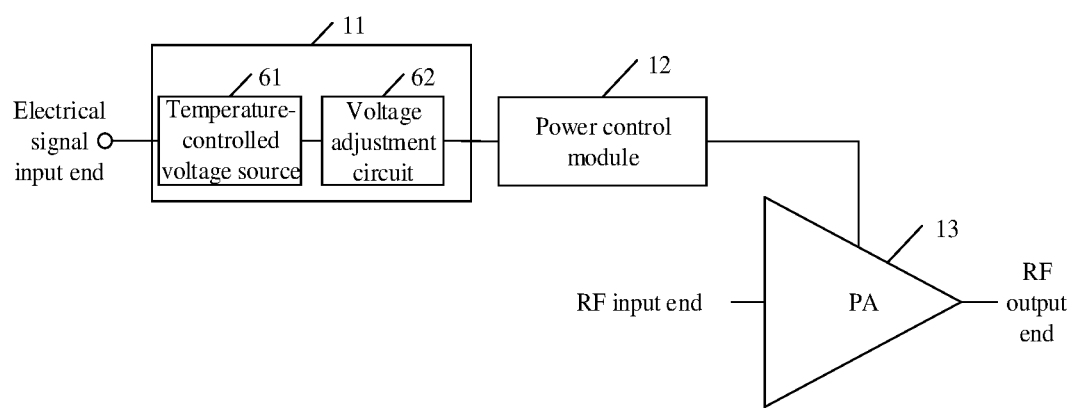
FIG. 6 is a schematic diagram of a third composition structure of a temperature compensation circuit according to an embodiment of the disclosure.

FIG. 6 is a schematic diagram of a third composition structure of a temperature compensation circuit according to an embodiment of the disclosure. As shown in FIG. 6, the temperature compensation circuit 11 may also be a voltage compensation circuit, and specifically, the voltage compensation circuit may include a temperature-controlled voltage source 61 and a voltage adjustment circuit 62.

The temperature-controlled voltage source 61 is configured to provide a voltage signal varying with temperature. The voltage adjustment circuit 62 is configured to adjust the voltage signal provided by the temperature-controlled voltage source to the first electrical signal.

That is, when the voltage is compensated, the voltage compensation circuit generates a first electrical signal corresponding to current ambient temperature; adjusts, by using the first electrical signal, a second electrical signal received by an electrical signal input end, to obtain a third electrical signal; and outputs the third electrical signal to a power control circuit 12.

The power control circuit 12 is configured to convert the third electrical signal into a fourth electrical signal and output the fourth electrical signal to PA 13, here the fourth electrical signal controls gain of PA 13 to present a preset variation rule with variation of temperature.

Specifically, the temperature-controlled voltage source is configured to provide a voltage signal varying with temperature to the voltage adjustment circuit. The voltage signal output by the temperature-controlled voltage source is proportional to the absolute temperature. The voltage adjustment circuit has functions of voltage amplification and reduction, and other functions, so as to provide accurate voltage signals to subsequent circuits. The voltage adjustment circuit may include combination of resistors, capacitors, transistors and other elements.

With the above solution, by adding the aforementioned temperature compensation circuit in a power amplification circuit, temperature compensation is performed on the external input voltage Vramp for power control, stabilities of the gain and output power of PA are ensured, and performance of PA is not affected by variation of temperature.

Figure 7:
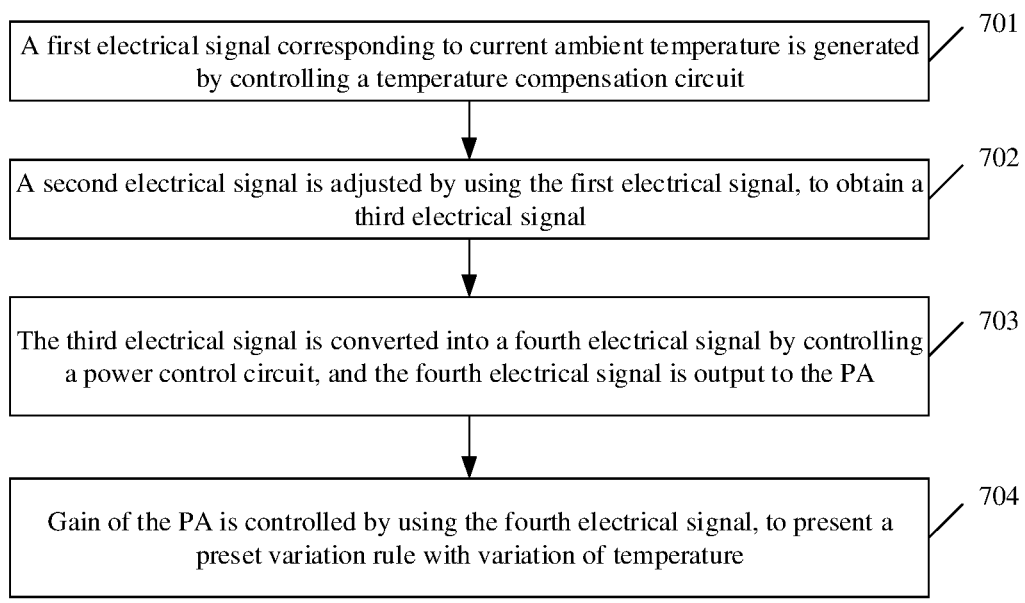
FIG. 7 is a schematic flowchart of a temperature control method of a PA according to an embodiment of the disclosure.

Based on the aforementioned temperature control circuit of PA, an embodiment of the disclosure also provides an embodiment of a temperature control method of PA. FIG. 7 is a schematic flowchart of a temperature control method of a PA according to an embodiment of the disclosure. As shown in FIG. 7, the method includes the following operations 701-704.

In operation 701, a first electrical signal corresponding to current ambient temperature is generated by controlling a temperature compensation circuit.

In operation 702, a second electrical signal is adjusted by using the first electrical signal, to obtain a third electrical signal.

In operation 703, the third electrical signal is converted into a fourth electrical signal by controlling a power control circuit, and the fourth electrical signal is output to the PA.

In operation 704, gain of the PA is controlled by using the fourth electrical signal, to present a preset variation rule with variation of temperature.

In some embodiments, the temperature compensation circuit may include a current compensation circuit and a current-to-voltage conversion circuit. The current compensation circuit is configured to: generate the first electrical signal corresponding to the current ambient temperature; and output the first electrical signal to adjust the second electrical signal, to obtain an intermediate electrical signal, here each of the first electrical signal, the second electrical signal and the intermediate electrical signal is a current signal. The current-to-voltage conversion circuit is configured to convert the intermediate electrical signal into the third electrical signal to be output, here the third electrical signal is a voltage signal.

In some embodiments, the current compensation circuit may include a temperature-controlled current source and a current adjustment circuit. The temperature-controlled current source is configured to provide a current signal varying with temperature. The current adjustment circuit is configured to adjust the current signal provided by the temperature-controlled current source to the first electrical signal.

In some embodiments, the current adjustment circuit may include a steady state current source, a first FET and a second FET. The steady state current source has an end connected to a first voltage source and another end connected to the temperature-controlled current source, and an intermediate connection node between the steady state current source and the temperature-controlled current source is connected to a gate and a drain of the first FET. The gate of the first FET is connected to a gate of the second FET. A source of the first FET and a source of the second FET are connected to a second voltage source. A drain of the second FET is used as an output end of the current compensation circuit, to output the first electrical signal. Here each of the first FET and the second FET is a P-type FET.

In some embodiments, the current-to-voltage conversion circuit may include a first resistor having an end connected to ground and another end connected to an output end of the current compensation circuit and an input end of the power control circuit.

In some embodiments, the current-to-voltage conversion circuit may further include a first capacitor connected in parallel with the first resistor.

In some embodiments, the preset variation rule may be that the gain of the PA increases with temperature rising and decreases with temperature dropping.

In some embodiments, the temperature compensation circuit may be a voltage compensation circuit which includes a temperature-controlled voltage source and a voltage adjustment circuit. The temperature-controlled voltage source is configured to provide a voltage signal varying with temperature. The voltage adjustment circuit is configured to adjust the voltage signal provided by the temperature-controlled voltage source to the first electrical signal. Each of the first electrical signal and the second electrical signal may be a voltage signal.

In some embodiments, the power control circuit may include at least a LDO having a forward input end used as an input end of the power control circuit to receive the third electrical signal.

With the above solution, by adding the aforementioned temperature compensation circuit in a power amplification circuit, stabilities of the gain and output power of PA are ensured, and performance of PA is not affected by variation of temperature.

The technical solutions described in the embodiments of the disclosure may be combined arbitrarily without conflict.

In several embodiments provided in the disclosure, It should be understood that embodiments of the aforementioned temperature compensation circuit are merely illustrative, however, the scope of protection of the disclosure is not limited thereto. Variation or replacement readily conceivable by any person skilled in the art within the technical scope of the disclosure shall fall within the scope of protection of the disclosure.

The disclosure provides a temperature compensation circuit of a PA and a temperature compensation method of a PA. The temperature compensation circuit is configured to: generate a first electrical signal corresponding to current ambient temperature; adjust, by using the first electrical signal, a second electrical signal received by an electrical signal input end, to obtain a third electrical signal; and output the third electrical signal to a power control circuit which is configured to convert the third electrical signal into a fourth electrical signal and output the fourth electrical signal to the PA, here the fourth electrical signal controls gain of the PA to present a preset variation rule with variation of temperature. In this way, by adding the aforementioned temperature compensation circuit in a power amplification circuit, stabilities of the gain and output power of PA are ensured, and performance of PA is not affected by variation of temperature.

What is claimed is:

1. A temperature compensation circuit of a power amplifier (PA), configured to: generate a first electrical signal corresponding to current ambient temperature; adjust, by using the first electrical signal, a second electrical signal received by an electrical signal input end, to obtain a third electrical signal; and output the third electrical signal to a power control circuit which is configured to convert the third electrical signal into a fourth electrical signal and output the fourth electrical signal to the PA, wherein the fourth electrical signal controls gain of the PA to present a preset variation rule with variation of temperature;

wherein the temperature compensation circuit comprises:

a current compensation circuit configured to: generate the first electrical signal corresponding to the current ambient temperature; and output the first electrical signal to adjust the second electrical signal, to obtain an intermediate electrical signal, each of the first electrical signal, the second electrical signal and the intermediate electrical signal being a current signal; and a current-to-voltage conversion circuit configured to convert the intermediate electrical signal into the third electrical signal to be output, wherein the third electrical signal is a voltage signal.

2. The temperature compensation circuit of claim 1, wherein the current compensation circuit comprises:

a temperature-controlled current source configured to provide a current signal varying with temperature; and a current adjustment circuit configured to adjust the current signal provided by the temperature-controlled current source to the first electrical signal.

3. The temperature compensation circuit of claim 2, wherein the current adjustment circuit comprises a steady state current source, a first Field-Effect Transistor (FET) and a second FET, the steady state current source has an end connected to a first voltage source and another end connected to the temperature-controlled current source, and an intermediate connection node between the steady state current source and the temperature-controlled current source is connected to a gate and a drain of the first FET, the gate of the first FET is connected to a gate of the second FET, a source of the first FET and a source of the second FET are connected to a second voltage source, a drain of the second FET is used as an output end of the current compensation circuit, to output the first electrical signal.

4. The temperature compensation circuit of claim 1, wherein the current-to-voltage conversion circuit comprises a first resistor having an end connected to ground and another end connected to an output end of the current compensation circuit and an input end of the power control circuit.

5. The temperature compensation circuit of claim 4, wherein the current-to-voltage conversion circuit further comprises a first capacitor connected in parallel with the first resistor.

6. The temperature compensation circuit of claim 1, wherein the preset variation rule is that the gain of the PA increases with temperature rising and decreases with temperature dropping.

7. A temperature compensation circuit of a power amplifier (PA), configured to: generate a first electrical signal corresponding to current ambient temperature; adjust, by using the first electrical signal, a second electrical signal received by an electrical signal input end, to obtain a third electrical signal; and output the third electrical signal to a power control circuit which is configured to convert the third electrical signal into a fourth electrical signal and output the fourth electrical signal to the PA, wherein the fourth electrical signal controls gain of the PA to present a preset variation rule with variation of temperature;

the temperature compensation circuit being a voltage compensation circuit which comprises:

a temperature-controlled voltage source configured to provide a voltage signal varying with temperature; and a voltage adjustment circuit configured to adjust the voltage signal provided by the temperature-controlled voltage source to the first electrical signal, each of the first electrical signal and the second electrical signal being a voltage signal.

8. The temperature compensation circuit of claim 1, wherein the power control circuit comprises at least a Low Dropout Regulator (LDO) having a forward input end used as an input end of the power control circuit to receive the third electrical signal.

9. A temperature compensation method of a power amplifier (PA), comprising:

generating, by controlling a temperature compensation circuit, a first electrical signal corresponding to current ambient temperature;

adjusting a second electrical signal by using the first electrical signal, to obtain a third electrical signal;

converting, by controlling a power control circuit, the third electrical signal into a fourth electrical signal, and outputting the fourth electrical signal to the PA; and controlling, by using the fourth electrical signal, gain of the PA to present a preset variation rule with variation of temperature;

the method further comprising:

providing a voltage signal varying with temperature; and adjusting the voltage signal provided by a temperature-controlled voltage source to the first electrical signal, each of the first electrical signal and the second electrical signal being a voltage signal.

* * * * *